(12) United States Patent
Matsushima et al.

(10) Patent No.: US 7,641,817 B2
(45) Date of Patent: Jan. 5, 2010

(54) SILVER POWDER AND METHOD FOR PRODUCING SAME

(75) Inventors: Hiroshi Matsushima, Honjo (JP); Kozo Ogi, Honjo (JP)

(73) Assignee: Dowa Mining Co., Ltd., Tokyo (JP)

( * ) Notice: Subject to any disclaimer, the term of this patent is extended or adjusted under 35 U.S.C. 154(b) by 311 days.

(21) Appl. No.: 11/045,974

(22) Filed: Jan. 28, 2005

(65) Prior Publication Data

US 2005/0167640 A1 Aug. 4, 2005

(30) Foreign Application Priority Data

Feb. 3, 2004 (JP) ............................. 2004-027092

(51) Int. Cl.
*H01B 1/02* (2006.01)
*H01B 1/22* (2006.01)

(52) U.S. Cl. ..................... 252/512; 74/370; 423/34; 427/98.4; 427/304; 503/212; 524/413; 548/108

(58) Field of Classification Search .............. 252/512, 252/500, 514; 75/741, 370, 255, 362, 365, 75/367, 371; 549/534; 427/98.4, 34, 304; 503/212; 548/108; 524/413; 424/63; 74/370; 423/34

See application file for complete search history.

(56) References Cited

U.S. PATENT DOCUMENTS

| | | | | | |
|---|---|---|---|---|---|
| 3,699,114 | A | * | 10/1972 | Ohkubo et al. | ............... 548/108 |
| 4,333,966 | A | * | 6/1982 | Deffeyes et al. | ............ 427/98.4 |
| 4,353,741 | A | * | 10/1982 | Capuano et al. | ............. 549/534 |
| 5,000,928 | A | * | 3/1991 | White | .......................... 423/34 |
| 5,188,660 | A | * | 2/1993 | Tosun et al. | .................... 75/370 |
| 5,389,122 | A | * | 2/1995 | Glicksman | ................... 75/370 |
| 5,395,651 | A | * | 3/1995 | Sodervall et al. | ............ 427/304 |
| 6,110,254 | A | * | 8/2000 | Johnson et al. | ................ 75/741 |
| 6,211,116 | B1 | * | 4/2001 | Defieuw et al. | ............. 503/212 |
| 7,022,266 | B1 | * | 4/2006 | Craig | .......................... 252/512 |
| 2006/0047043 | A1 | * | 3/2006 | Nakayoshi et al. | .......... 524/413 |

FOREIGN PATENT DOCUMENTS

| | | | |
|---|---|---|---|
| JP | 07-041811 | * | 2/1995 |
| JP | 08-176620 | * | 7/1996 |
| JP | 10-88206 | | 4/1998 |
| JP | 2000-239713 | * | 9/2000 |
| JP | 2000-265202 | * | 9/2000 |
| JP | 2001-107101 | * | 4/2001 |
| JP | 2002-08091 | * | 3/2002 |
| JP | 2002-80901 | | 3/2002 |
| JP | 2002-080901 | * | 3/2002 |
| JP | 2003-253312 | * | 9/2003 |
| JP | 2004-100013 | * | 4/2004 |
| WO | WO 96/17975 | * | 6/1996 |

\* cited by examiner

*Primary Examiner*—Mark Kopec
*Assistant Examiner*—Khanh Tuan Nguyen
(74) *Attorney, Agent, or Firm*—Bachman & LaPointe, P.C.

(57) ABSTRACT

There is provided a method for producing a silver powder having excellent dispersibility and capable of forming a paste which do not form suspended matters by phase separation and which is printed on a substrate to form a film having a uniform thickness. In this method, an alkali or a complexing agent is added to an aqueous silver salt containing solution to form a silver oxide containing slurry or an aqueous silver complex salt containing solution. After or before silver particles are deposited by reduction by adding a reducing agent to the silver oxide containing slurry or aqueous silver complex salt containing solution while stirring it, at least one chelating agent selected from the group consisting of compounds having an azole structure, dicarboxylic acids, hydroxy carboxylic acids and salts thereof is added to a silver power containing slurry solution as a dispersing agent.

3 Claims, No Drawings

SILVER POWDER AND METHOD FOR PRODUCING SAME

BACKGROUND OF THE INVENTION

1. Field of the Invention

The present invention generally relates to a silver powder and a method for producing the same. More specifically, the invention relates to a silver powder for a conductive paste for use in electronic parts, such as internal electrodes of multilayer capacitors, conductive patterns of circuit boards, and electrodes and circuits of substrates for plasma display panels, and a method for producing the same.

2. Description of the Prior Art

As a conventional conductive paste for use in electronic parts, such as internal electrodes of multilayer capacitors, conductive patterns of circuit boards, and electrodes and circuits of substrates for plasma display panels (PDP), there is used a silver paste produced by mixing a silver powder and a glass frit in an organic vehicle and kneading them. As the size of such electronic parts decreases, it is required that a silver powder for a conductive paste has reasonably small particle diameters and a reasonably narrow range of particle diameters in order to form a conductive pattern or the like having a high density and fine lines.

As a method for producing such a silver powder for a conductive paste, there is known a method for adding an alkali or a complexing agent to an aqueous silver salt containing solution to form a silver oxide containing slurry or an aqueous silver complex salt containing solution, and thereafter, adding a reducing agent to the silver oxide containing slurry or the aqueous silver complex salt containing solution to deposit a silver powder by reduction.

However, the particles of the silver powder produced by such a conventional method violently cohere, so that there is a problem in that the silver powder can not be applied to recent electronic parts having fine lines, such as internal electrodes of multilayer capacitors, conductive patterns of circuit boards, and electrodes and circuits of substrates for plasma display panels.

Thus, in order to form a silver powder which includes a smaller number of particles easy to cohere and which has excellent dispersibility, there has been proposed a method comprising the steps of: adding an alkali or a complexing agent to an aqueous silver salt containing solution to form a silver oxide containing slurry or an aqueous silver complex salt containing solution; adding a reducing agent thereto to deposit silver particles by reduction; and thereafter, adding at least one of fatty acids, fatty acid salts, surface active agents, organic metals and protective colloids, serving as a dispersing agent to the silver containing slurry solution to form a silver powder (see, e.g., Japanese Patent Laid-Open No. 10-88206).

However, if the silver powder formed by adding a fatty acid, a surface active agent or the like as a dispersing agent as described in Japanese Patent Laid-Open No. 10-88206 is used for preparing a paste, there are some cases where the paste causes phase separation to form suspended matters. The suspended matters form pinholes in the film of the paste to decrease the density of the film after burning.

If a paste prepared by using the silver powder formed by adding a fatty acid, a surface active agent or the like as a dispersing agent as described in Japanese Patent Laid-Open No. 10-88206 is printed on a substrate, there are some cases where the paste is not easily released from a screen plate, so that bubbles are drawn into the paste. As a result, there are some cases where the thickness of the burned film is not uniform, so that the value of resistance of the film varies. Therefore, such a paste is unsuitable for a conductive pattern.

In particular, in a conductive paste for use in an electrode of a substrate for a plasma display panel, which is required to have a high density and fine lines, the decrease of the density of the film causes severe problems.

In addition, as a conductive paste used for forming an electrode of a substrate for a plasma display panel, an alkali developable photosensitive paste is ordinarily used. The alkali developable photosensitive paste generally comprises an alkali soluble polymer, a polymerizable monomer, a photopolymerization initiator, a solvent, a glass frit and a stabilizer. However, the alkali soluble polymer contains a carboxyl group to have a high polarity, so that there are problems in that bubbles are easily drawn into the paste during the screen printing, and the thickness of the burned film is not uniform.

SUMMARY OF THE INVENTION

It is therefore an object of the present invention to eliminate the aforementioned problems and to provide a silver powder having excellent dispersibility and capable of forming a paste which do not form suspended matters by phase separation and which is printed on a substrate to form a film having a uniform thickness, and a method for producing the same.

In order to accomplish the aforementioned and other objects, the inventors have diligently studied and found that it is possible to produce a silver powder having excellent dispersibility and capable of forming a paste which do not form suspended matters by phase separation and which is printed on a substrate to form a film having a uniform thickness, if at least one chelating agent selected from compounds having an azole structure, dicarboxylic acids, hydroxy carboxylic acids and salts thereof is added to a silver powder containing slurry solution as a dispersing agent before or after silver particles are deposited by reduction by adding a reducing agent to a silver oxide containing slurry or aqueous silver complex salt containing solution, which is formed by adding an alkali or a complexing agent to an aqueous silver salt containing solution, while stirring it. Thus, the inventors have made the present invention.

According to one aspect of the present invention, there is provided a method for producing a silver powder, the method comprising the steps of: adding a reducing agent to a water reaction system containing at least one of a silver salt and silver oxide, to deposit silver particles; and adding a chelating agent to the water reaction system as a dispersing agent. In this method for producing a silver powder, the chelating agent may be added after the reducing agent is added to deposit the silver particles, or the chelating agent may be added before the reducing agent is added to deposit the silver particles. The chelating agent is preferably at least one selected from the group consisting of compounds having an azole structure, dicarboxylic acids, hydroxy carboxylic acids and salts thereof.

According to another aspect of the present invention, there is provided a silver powder having a tap density of 2 $g/cm^3$ or more, a mean particle diameter of 0.1 to 5 μm which is measured by a laser diffraction method, a specific surface area of 5 $m^2/g$ or less, and an angle of repose of 50° or less, preferably 45° or less, and more preferably 40° or less. If the tap density is less than 2 $g/cm^3$, silver particles violently cohere, so that it is difficult to form fine lines. If the mean particle diameter measured by the laser diffraction method is less than 0.1 μm, the activity of silver particles increases so that the silver powder is not suited to be burned at a temperature of 500° C. or higher, although it is possible to form fine lines. On the other hand, if the mean particle diameter measured by the laser diffraction method exceeds 5 μm, dispersibility deteriorates, so that it is also difficult to form fine lines. If the specific surface area exceeds 5 m$^2$/g, the viscosity of a paste using the silver powder is too high, so that printing characteristics deteriorate. Moreover, as the angle of repose decreases, the flowability of the silver powder increases, so that the silver powder can be more easily handled. Such a silver powder can be produced by the above described method for producing a silver powder.

According to a further aspect of the present invention, there is provided a silver powder wherein a film formed by printing a paste, which is prepared by using the silver powder, on a substrate has a surface roughness of 3 μm or less, and wherein silver particles in the paste has a maximum particle diameter of 30 μm or less, preferably 15 μm or less, and more preferably 7.5 μm or less, when it is measured by a grind gauge. Such a silver powder can be produced by the above described method for producing a silver powder.

According to the present invention, it is possible to produce a silver powder having excellent dispersibility and capable of forming a paste which do not form suspended matters by phase separation and which is printed on a substrate to form a film having a uniform thickness.

DESCRIPTION OF THE PREFERRED EMBODIMENTS

In a preferred embodiment of a method for producing a silver powder according to the present invention, an alkali or a complexing agent, preferably aqueous ammonia, is added to an aqueous silver salt containing solution to form a silver oxide containing slurry or an aqueous silver complex salt containing solution, preferably an aqueous silver ammine complex solution, and an alkali is added thereto for controlling the pH of the slurry or solution in order to control the particle diameter of a silver powder to be produced. Then, after silver particles are deposited by reduction by adding a reducing agent to the silver oxide containing slurry or aqueous silver complex salt containing solution while stirring it, a chelating agent is added to the silver containing slurry as a dispersing agent. Alternatively, after the dispersing agent is added to the silver oxide containing slurry or aqueous silver complex salt containing solution while stirring it, silver particles may be deposited by reduction by adding the reducing agent.

The chelating agent used as the dispersing agent is preferably selected from the group consisting of compounds having an azole structure, dicarboxylic acids, hydroxy carboxylic acids and salts thereof.

As examples of compounds having an azole structure used as the dispersing agent, there are imidazole, oxazole, thiazole, selenazole, pyrazole, isoxazole, isothiazole, 1H-1,2,3-triazole, 2H-1,2,3-triazole, 1H-1,2,4-triazole, 4H-1,2,4-triazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1H-1,2,3,4-tetrazole, 1,2,3,4-oxatriazole, 1,2,3,4-thiatriazole, 2H-1,2,3,4-tetrazole, 1,2,3,5-oxatriazole, 1,2,3,5-thiatriazole, indazole, benzoimidazole, benzotriazole and salts thereof.

As examples of dicarboxylic acids used as the dispersing agent, there are oxalic acid, succinic acid, malonic acid, glutaric acid, adipic acid, pimelic acid, suberic acid, azelaic acid, sebacic acid, didodecanoic acid, maleic acid, fumaric acid, phthalic acid, isophthalic acid and terephthalic acid.

As examples of hydroxy carboxylic acids used as the dispersing agent, there are glycolic acid, lactic acid, hydroxy butyric acid, glyceric acid, tartaric acid, malic acid, tartronic acid, hydracrylic acid, mandelic acid, citric acid and ascorbic acid.

The silver containing slurry thus obtained is filtered, washed with water, dried and pulverized into fine silver particles to obtain a silver powder. In place of the pulverizing into fine silver particles, there may be carried out a surface smoothing process for smoothing irregularities and angular portions on the surface of the silver particles by mechanically causing the silver particles to collide with each other by means of an apparatus capable of mechanically fluidizing particles as described in Japanese Patent Laid-Open No. 2002-80901.

The silver powder thus obtained has a tap density of 2 g/cm$^3$ or more, a mean particle diameter of 0.1 to 5 μm which is measured by the laser diffraction method, a specific surface area of 5 m$^2$/g or less, an angle or repose of 45° or less, and excellent dispersibility.

If the silver powder thus obtained is mixed with a vehicle to form a paste, suspended matters are not formed therein by phase separation. If the paste is printed on a substrate to be dried, the film thus formed has a surface roughness of 3 μm or less, and the thickness of the film can be uniform. If the grain size of silver particles contained in the paste is evaluated by a grind gauge, the maximum particle diameter $D_{max}$ is 10 μm or less, and the silver particles have excellent dispersibility.

Examples of a silver powder and a method for producing the same according to the present invention will be described below in detail.

EXAMPLE 1

To 3600 ml of an aqueous solution containing 12 g/l silver nitrate as silver ions, 180 ml of 25% aqueous ammonia and 15 ml of an aqueous solution containing 20 g/l sodium hydroxide were added to obtain an aqueous silver ammine complex salt solution. The temperature of the aqueous silver ammine complex salt solution was maintained at 40° C., and 192 ml of formalin (an aqueous solution containing 37% formaldehyde) was added to the aqueous silver ammine complex salt solution to deposit silver particles. Thirty seconds after formalin was completely added thereto, 1% of benzotriazole with respect to the weight of silver was added to the slurry. The silver containing slurry thus obtained was filtered, washed with water, dried and pulverized into fine silver particles to obtain a silver powder. The tap density of the obtained silver powder was 4.0 g/cm$^3$, and the mean particle diameter of the silver powder measured by the laser diffraction method was 2.8 μm. The specific surface area of the silver powder was 0.34 m$^2$/g, and the angle of repose of the silver powder measured in accordance with JIS R9301-2-2 was 40°.

To 35 parts by weight of a vehicle consisting of 30 parts by weight of acrylic resin (BR605 produced by Mitsubishi Rayon Co., Ltd.) and 70 parts by weight of ethyl carbitol acetate, 65 parts by weight of the obtained silver powder was added and sufficiently kneaded to be dispersed by a three-roll mill to obtain a paste. In this paste, suspended matters caused by phase separation were not formed.

The paste thus obtained was printed on a substrate by using a screen mask of 325 meshes, and dried at 150° C. for ten minutes to form a film on the substrate. Thereafter, the surface roughness of the film of the paste was measured by a super depth shape measuring microscope (VK-8510 produced by KEYENCE). As a result, the surface roughness was 2.1 μm, and the thickness of the film of the paste was uniform.

The grain size of silver particles contained in the obtained paste was evaluated by a grind gauge. As a result, the maximum particle diameter $D_{max}$ was 6 µm, and the fourth scratch (the fourth particle diameter from the maximum particle diameter when the grain size of silver particles in the paste was measured by the grind gauge) was 6 µm. In addition, the mean particle diameter $D_{50}$ was 3 µm, and excellent dispersibility was obtained.

EXAMPLE 2

To 3600 ml of an aqueous solution containing 12 g/l silver nitrate as silver ions, 180 ml of 25% aqueous ammonia and 15 ml of an aqueous solution containing 20 g/l sodium hydroxide were added to obtain an aqueous silver ammine complex salt solution. While the temperature of the aqueous silver ammine complex salt solution was maintained at 40° C., 0.4 g of an aqueous solution containing 40% benzotriazole sodium was added to the aqueous silver ammine complex salt solution, and then, 192 ml of formalin (an aqueous solution containing 37% formaldehyde) was added thereto to deposit silver particles. The silver containing slurry thus obtained was filtered, washed with water, dried and pulverized into fine silver particles to obtain a silver powder. The tap density of the obtained silver powder was 4.1 g/cm$^3$, and the mean particle diameter of the silver powder measured by the laser diffraction method was 3.3 µm. The specific surface area of the silver powder was 0.31 m$^2$/g, and the angle of repose of the silver powder measured in accordance with JIS R9301-2-2 was 45°.

In a paste prepared by the same method as that in Example 1 using the silver powder obtained in Example 2, suspended matters caused by phase separation were not formed. The surface roughness of the film of the paste measured by the same method as that in Example 1 was 2.7 µm, and the thickness of the film of the paste was uniform. Moreover, the grain size of silver particles contained in the paste was evaluated by a grind gauge similar to Example 1. As a result, the maximum particle diameter $D_{max}$ was 5 µm, and the fourth scratch was 5 µm. In addition, the mean particle diameter $D_{50}$ was 3 µm, and excellent dispersibility was obtained.

EXAMPLE 3

To 3600 ml of an aqueous solution containing 12 g/l silver nitrate as silver ions, 180 ml of 25% aqueous ammonia and 15 ml of an aqueous solution containing 20 g/l sodium hydroxide were added to obtain an aqueous silver ammine complex salt solution. The temperature of the aqueous silver ammine complex salt solution was maintained at 40° C., and 192 ml of formalin (an aqueous solution containing 37% formaldehyde) was added to the aqueous silver ammine complex salt solution to deposit silver particles. After formalin was completely added thereto, 0.1% of succinic acid with respect to the weight of silver was added to the slurry. The silver containing slurry thus obtained was filtered, washed with water, dried and pulverized into fine silver particles to obtain a silver powder. The tap density of the obtained silver powder was 2.6 g/cm$^3$, and the mean particle diameter of the silver powder measured by the laser diffraction method was 4.5 µm. The specific surface area of the silver powder was 0.36 m$^2$/g, and the angle of repose of the silver powder measured in accordance with JIS R9301-2-2 was 40°.

In a paste prepared by the same method as that in Example 1 using the silver powder obtained in Example 3, suspended matters caused by phase separation were not formed. The surface roughness of the film of the paste measured by the same method as that in Example 1 was 2.5 µm, and the thickness of the film of the paste was uniform. Moreover, the grain size of silver particles contained in the paste was evaluated by a grind gauge similar to Example 1. As a result, the maximum particle diameter $D_{max}$ was 7 µm, and the fourth scratch was 6 µm. In addition, the mean particle diameter $D_{50}$ was 3 µm, and excellent dispersibility was obtained.

EXAMPLE 4

To 3600 ml of an aqueous solution containing 12 g/l silver nitrate as silver ions, 180 ml of 25% aqueous ammonia and 16 ml of an aqueous solution containing 75 g/l sodium hydroxide were added to obtain an aqueous silver ammine complex salt solution. The temperature of the aqueous silver ammine complex salt solution was maintained at 40° C., and 192 ml of formalin (an aqueous solution containing 37% formaldehyde) was added to the aqueous silver ammine complex salt solution to deposit silver particles. After formalin was completely added thereto, 1% of benzotriazole with respect to the weight of silver was added to the slurry. The silver containing slurry thus obtained was filtered, washed with water, and dried to obtain silver particles. Then, the surface of each of the silver particles was smoothed by a cylindrical high-speed mixer, which is capable of mechanically fluidizing particles, to obtain a silver powder. The tap density of the obtained silver powder was 4.4 g/cm$^3$, and the mean particle diameter of the silver powder measured by the laser diffraction method was 2.4 µm. The specific surface area of the silver powder was 0.46 m$^2$/g, and the angle of repose of the silver powder measured in accordance with JIS R9301-2-2 was 40°.

In a paste prepared by the same method as that in Example 1 using the silver powder obtained in Example 4, suspended matters caused by phase separation were not formed. The surface roughness of the film of the paste measured by the same method as that in Example 1 was 2.2 µm, and the thickness of the film of the paste was uniform. Moreover, the grain size of silver particles contained in the paste was evaluated by a grind gauge similar to Example 1. As a result, the maximum particle diameter $D_{max}$ was 5 µm, and the fourth scratch was 5 µm. In addition, the mean particle diameter $D_{50}$ was 3 µm, and excellent dispersibility was obtained.

Comparative Example

To 3600 ml of an aqueous solution containing 12 g/l silver nitrate as silver ions, 180 ml of 25% aqueous ammonia and 15 ml of an aqueous solution containing 20 g/l sodium hydroxide were added to obtain an aqueous silver ammine complex salt solution. The temperature of the aqueous silver ammine complex salt solution was maintained at 40° C., and 192 ml of formalin (an aqueous solution containing 37% formaldehyde) was added to the aqueous silver ammine complex salt solution to deposit silver particles. After formalin was completely added thereto, 0.1% of myristic acid (fatty acid) with respect to the weight of silver was added to the slurry. The silver containing slurry thus obtained was filtered, washed with water, dried and pulverized into fine silver particles to obtain a silver powder. The tap density of the obtained silver powder was 3.4 g/cm$^3$, and the mean particle diameter of the silver powder measured by the laser diffraction method was 3.0 µm. The specific surface area of the silver powder was 0.40 m$^2$/g, and the angle of repose of the silver powder measured in accordance with JIS R9301-2-2 was 55° which was far greater than those in Examples 1 through 4.

In a paste prepared by the same method as that in Example 1 using the silver powder obtained in this comparative example, suspended matters caused by phase separation were formed. The surface roughness of the film of the paste measured by the same method as that in Example 1 was 3.2 µm, and the thickness of the film of the paste was not uniform. Moreover, the grain size of silver particles contained in the paste was evaluated by a grind gauge similar to Example 1. As a result, the maximum particle diameter $D_{max}$ was 33 µm, and the fourth scratch was 7 µm. In addition, the mean particle diameter $D_{50}$ was 4 µm, and good dispersibility was not obtained.

The results in Examples 1 through 4 and Comparative Example are shown in Tables 1 through 3.

TABLE 1

|  | dispersing agent | timing in adding dispersing agent |
| --- | --- | --- |
| Example 1 | benzotriazole | after adding reducing agent |
| Example 2 | benzotriazole sodium | before adding reducing agent |
| Example 3 | succinic acid (dicarboxylic acid) | after adding reducing agent |
| Example 4 | benzotriazole | after adding reducing agent |
| Comparative Example | myristic acid (fatty acid) | after adding reducing agent |

TABLE 2

|  | tap density (g/cm³) | mean particle diameter (µm) | specific surface area (m²/g) | angle of repose |
| --- | --- | --- | --- | --- |
| Example 1 | 4.0 | 2.8 | 0.34 | 40° |
| Example 2 | 4.1 | 3.3 | 0.31 | 45° |
| Example 3 | 2.6 | 4.5 | 0.36 | 40° |
| Example 4 | 4.4 | 2.4 | 0.46 | 40° |
| Comparative Example | 3.4 | 3.0 | 0.40 | 55° |

TABLE 3

|  | suspended matters | surface roughness (µm) | grind gauge (µm) | | |
| --- | --- | --- | --- | --- | --- |
|  |  |  | $D_{max}$ | 4th | $D_{50}$ |
| Example 1 | none | 2.1 | 6 | 6 | 3 |
| Example 2 | none | 2.7 | 5 | 5 | 3 |
| Example 3 | none | 2.5 | 7 | 6 | 3 |
| Example 4 | none | 2.2 | 5 | 5 | 3 |
| Comparative Example | existence | 3.2 | 33 | 7 | 4 |

What is claimed is:

1. A method for producing a silver powder, said method comprising the steps of:
    adding a reducing agent to an aqueous solution of at least one of a silver salt and silver oxide for depositing silver particles to form a silver containing slurry;
    adding a dispersing agent to said aqueous solution for dispersing said silver particles in said silver containing slurry; and
    filtering, washing and drying said silver containing slurry to form a silver powder,
    wherein said dispersing agent is added before said reducing agent is added to deposit the silver particles, and
    said dispersing agent is at least one selected from the group consisting of compounds having an azole structure and salts thereof.

2. A method for producing a silver powder as set forth in claim 1, wherein said dispersing agent is benzotriazole or benzotriazole sodium.

3. A method for producing a silver powder as set forth in claim 1, wherein said aqueous solution is an aqueous silver ammine complex salt solution.

* * * * *

UNITED STATES PATENT AND TRADEMARK OFFICE
CERTIFICATE OF CORRECTION

PATENT NO. : 7,641,817 B2  Page 1 of 1
APPLICATION NO. : 11/045974
DATED : January 5, 2010
INVENTOR(S) : Matsushima et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 439 days.

Signed and Sealed this

Twenty-first Day of December, 2010

David J. Kappos
*Director of the United States Patent and Trademark Office*